(12) United States Patent
Wu

(10) Patent No.: US 6,204,517 B1
(45) Date of Patent: *Mar. 20, 2001

(54) SINGLE ELECTRON TRANSISTOR MEMORY ARRAY

(75) Inventor: Shye-Lin Wu, Hsinchu (TW)

(73) Assignee: Texas Instruments-Acer Incorporated, Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/057,869

(22) Filed: Apr. 9, 1998

(51) Int. Cl.[7] .................. H01L 31/0392; H01L 29/775; H01L 29/786
(52) U.S. Cl. ................ 257/51; 257/66; 257/204; 438/158; 438/279; 438/407
(58) Field of Search ................. 257/14, 51, 66, 257/204; 438/158, 279, 407

(56) References Cited

U.S. PATENT DOCUMENTS

| 5,405,454 | * | 4/1995 | Hirai et al. ............... 148/33.2 |
| 5,489,794 | * | 2/1996 | Nanaka et al. ............ 257/369 |
| 5,612,255 | * | 3/1997 | Chapple-Sokol et al. ... 437/203 |
| 5,885,877 | * | 3/1999 | Gardner et al. ........... 438/300 |

* cited by examiner

Primary Examiner—Olik Chaudhuri
Assistant Examiner—Douglas Wille

(57) ABSTRACT

A structure of a single-electron-transistor memory array is disclosed in the present invention. A substrate is provided. A buried oxide layer is on the substrate. A plurality of silicon wires are arranged on the buried oxide layer, wherein each of the silicon wires has a pair of ends. Oxynitride layers covers on the silicon wires. A polysilicon layer covers the oxynitride layers and the buried oxide layer. A source region and a drain region connect to a first end and a second end of each of the silicon wires, respectively.

4 Claims, 4 Drawing Sheets

SINGLE ELECTRON TRANSISTOR MEMORY ARRAY

FIELD OF THE INVENTION

The present invention relates to a structure of nanometer Si islands on silicon wafers, and more specifically, to a memory array with single electron transistors on the silicon wafers.

BACKGROUND OF THE INVENTION

The single electron transistor (SET) has become an essential element in electronics. The devices are operated by utilizing the Coulomb Blockade effect. However, the operation of SET device operation has been limited to below 4 K. The reason is that the smallest capacitance of the SET has been about 100 aF. This means that a charging energy $e^2/(2C)$ is much larger than the thermal energy, which could be met at very low temperature. In IEDM Tech. Dig. page 938 (1994), Y. Takajashi et al. reported a Si-SET whose capacitance is only about 2 aF. The Si-SET is reported in this paper shows conductance oscillation even at room temperature is reported in this paper. Thus, using semiconductor technique, a SET can be fabricated in a substrate and it is operated at room temperature. In this paper, a process which is separation by implanted oxygen (SIMOX) is used to form a superficial Si layer. The SET device is fabricated in the superficial Si layer. Then, by using semiconductor technique, the author fabricated a one-dimensional Si wire in the superficial Si layer. The Si wire width can be in the order of nanometers.

Recently, the room temperature operation of a single-electron memory was realized by a device using nanometer-sized, polycrystalline fine-grain Si for a floating gate and channel. In IEDM Tech. Dig., page 952 (1996), A. Nakajima et al. reported a Si single-electron memory with self-aligned floating gate. The authors reported a new Si single-electron memory device comprised of a narrow channel field effect transistor (FET) having an ultra-small self-aligned floating dot gate, which is capable to exhibit clear, single-electron memory effects at room temperature. In this paper, the Si single-electron FET memory has a width of about 30 nanometers and is operated at room temperature.

Many efforts have been undertaken to fabricate silicon-based SET devices. The smallest dimension required for SET operation depends on non-artificial process such as grain control and inhomogeneous oxidation, which can be hardly determined in the design stage. At page 955 of IEDM Tech. Dig. 1996, L. Guo et al. reported that a Si single-electron MOS memory (SEMM) is fabricated and the electrical characteristic of the device are detected. The device has a nanoscale floating-gate and a narrow gate. The capacitance for the 7 nm×7 nm floating gate and a 40 nm control oxide is $4 \times 10^{-20}$ F, giving single electron charging voltage of 4V. The SEMM device was fabricated by using silicon on insulator (SOI) technique. The channel of the device was fabricated using e-beam lithography and reactive ion etching. The channel had a width varying from 25 nm to 120 nm.

At page 4161 of vol. 36, Jpn. J. Appl. Phys. (1997), N. Yoshikawa et al reported a single-electron-tunneling effect in nanoscale granular microbridge. The granular microbridge was fabricated on an oxide step. A thin film was deposited on the oxide step. An ion etching was performed at an angle of 45 degrees and a microbridge was formed beside the oxide step.

In the last two papers, the methods of fabricating the single electron channel are nonartifical and are difficult to control. In other words, it is difficult for designers to design a good structure and to control the dimension of the channel. Thus, a simple and stable process method to fabricate the single electron transistor is necessary.

SUMMARY OF THE INVENTION

A structure of a memory array of single electron transistors is disclosed in the present invention.

A single-electron-transistor memory array comprises: A buried oxide layer on a substrate; a plurality of silicon wires arranging on the buried oxide layer, wherein each of the silicon wires having a pair of ends; oxynitride layers covering on the silicon wires; a polysilicon layer covering the oxynitride layers and the buried oxide layer; and a source region and a drain region connecting to a first end and a second end of each of the silicon wires, respectively.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A structure for nanometer Si islands on a silicon wafer is disclosed. The nanometer Si islands are fabricated to become single electron transistors. The present invention is explained with a preferred embodiment in following description.

Figure 11:
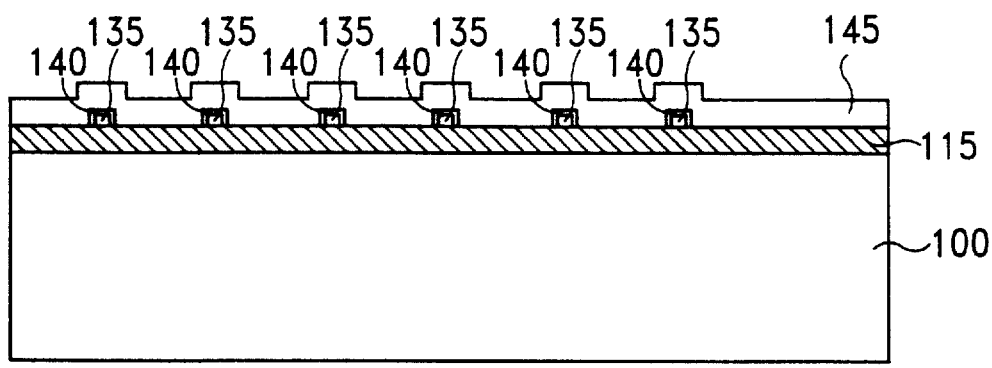
FIG. 11 is a cross-sectional view of a semiconductor substrate illustrating that a thick oxide layer is formed on the surface of the substrate and a metal contact is formed in the thick oxide layer.

Referring to FIG. 11, the structure is constructed on a semiconductor substrate 100. A silicon oxide layer is formed on the substrate 100 and it is referred as a buried oxide layer 115 as below. The buried silicon oxide layer 115 serves as an insulating layer and several single-electron transistors are fabricated on the buried silicon oxide layer 115. The thickness of the buried silicon oxide layer 115 is typically 0.3 to 0.5 micrometers. Then, several silicon wires 135 are fabricated on the buried silicon oxide layer 115 and these silicon wires 135 are separated from each other. As is known to those skilled in the art, the silicon wires 135 are narrow enough to be tunneled by an electron. The silicon wires 135 are covered by oxynitride layers 140 for isolation. After the formation of the silicon wires 135, a polysilicon layer 145 is formed on the oxynitride layers 140 and the substrate 100, and is connected a gate for controlling single-electron transistors.

Figure 12:
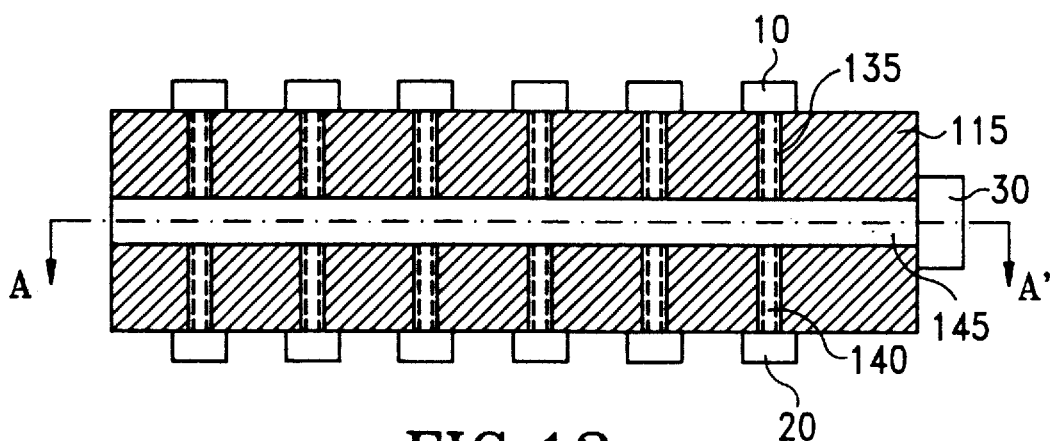
FIG. 12 is a top view of the present single electron transistor memory array.

Referring to FIG. 12, each of silicon wires 135 has two ends, one end connects to a source 10 and another end connects to a drain 20. Therefore, a single-electron-transistor memory array is formed on the substrate 100 and it consists of the silicon wires 135, the polysilicon layer 145 for connecting the gate, the source 10 and the drain 20. In the following description, a method for manufacturing a single-electron-transistor memory array on a substrate is explained with reference to FIGS. 1 to 11.

Figure 1:
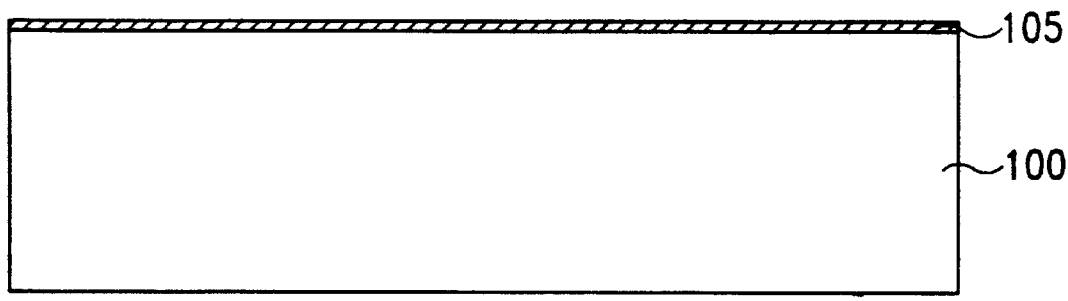
FIG. 1 is a cross-sectional view of a semiconductor substrate illustrating the formation of a pad oxide on the substrate in accordance with the present invention.

Turning to FIG. 1, a substrate 100 is provided and it is a single crystal P-type substrate with <100> crystallography orientation. A pad oxide 105 is formed on the substrate 100 using thermal oxidation in oxygen ambient and it has a thickness of between about 100 to 500 angstroms.

Figure 2:
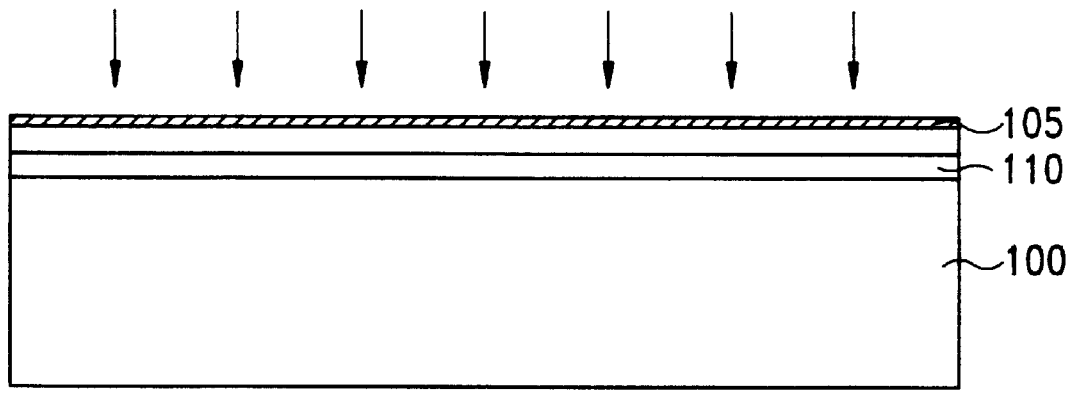
FIG. 2 is a cross-sectional view of a semiconductor substrate illustrating a blanket implantation to dope oxygen ions into the substrate in accordance with the present invention.

Turning to FIG. 2, oxygen ions are implanted into the substrate 100 with high dosage and an oxygen amphorized region is formed in the substrate 100. The high dosage is about $5 \times 10^{16}$ to $5 \times 10^{19}$ ions/cm$^2$ and the implanting energy is about 100 to 300 KeV.

Figure 3:
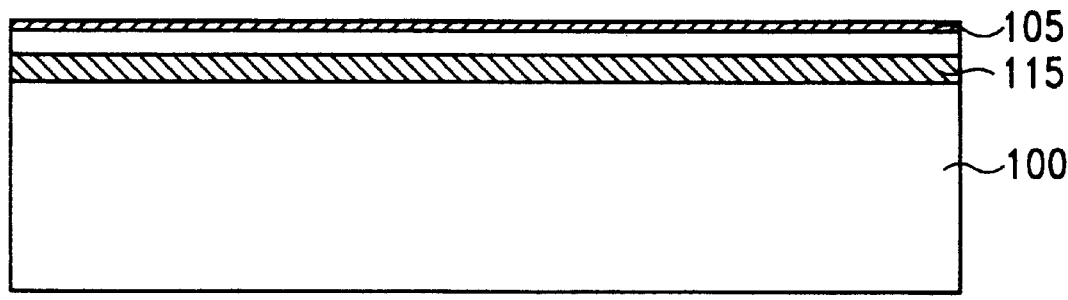
FIG. 3 is a cross-sectional view of a semiconductor substrate illustrating the formation of a buried oxide in the substrate in accordance with the present invention.

Next, turning to FIG. 3, a buried oxide layer 115 is formed in the substrate 100 by using a high temperature annealing to convert the oxygen amorphized region into a buried oxide layer. The annealing process is done in the neutral ambient of $N_2$ or $N_2/O_2$ mixture gases. The annealing time requires sufficient time (3–5 hours) and the annealing process uses a high temperature (1050–1250° C.). Typically, the depth of the buried oxide layer 115 is between about 0.3–0.5 micrometers. The technique of forming the buried oxide layer is the separation by implanted oxygen (SIMOX) process.

Figure 4:
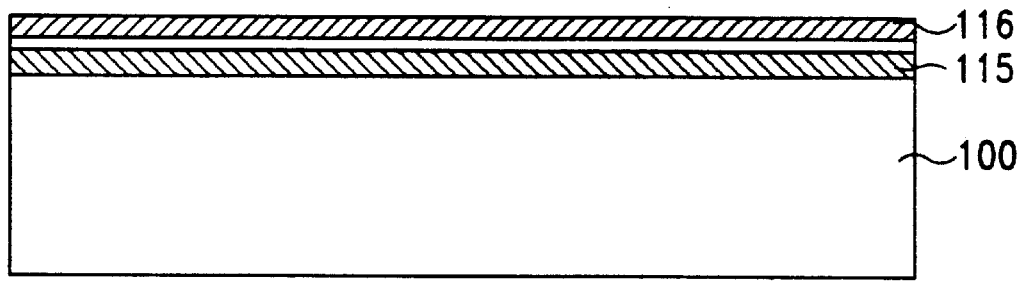
FIG. 4 is a cross-section view of a semiconductor substrate illustrating the formation of a thermal oxide to form nanometer Si substrate in accordance with the present invention.

As shown in FIG. 4, a thermal oxide 116 is formed on the substrate 100 using thermal oxidation. The thermal oxidation can reduce the thickness of the single crystal Si region between the thermal oxide 116 and the buried oxide layer 115. The Si substrate 100 between the thermal oxide 116 and the buried oxide layer 115 is about nanometer dimension because portion of the silicon substrate 100 on the buried oxide 115 is converted into thermal oxide.

Figure 5:
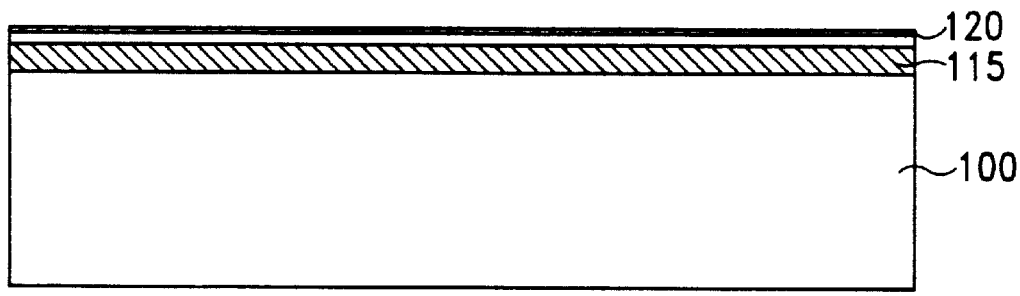
FIG. 5 is a cross-sectional view of a semiconductor substrate illustrating the removing of the thermal oxide and the formation of an ultra-thin oxide in accordance with the present invention.

Referring to FIG. 5, the thermal oxide 116 is removed and an ultra-thin oxide 120 is formed on the substrate 100. Typically, the thermal oxide 116 is removed by using buffer oxide etching (BOE) solution or diluted HF solution. An ultra-thin oxide 120 is regrown on the substrate 100 using thermal oxidation and it has a thickness between about 20 to 200 angstroms.

Figure 6:
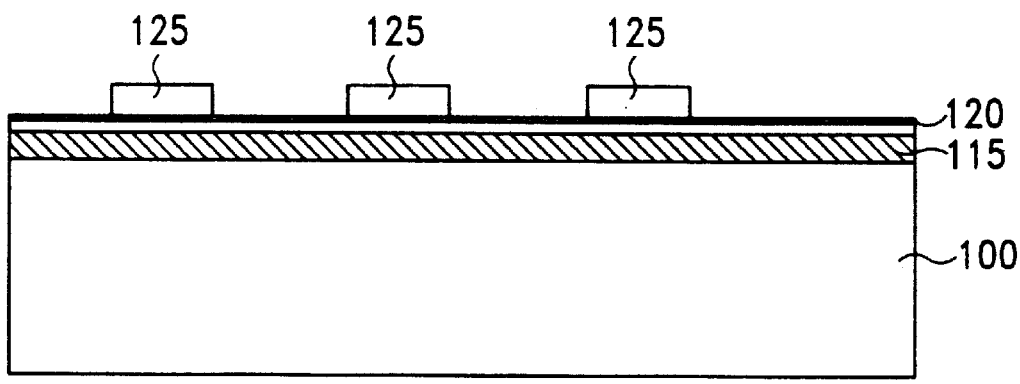
FIG. 6 is a cross-sectional view of a semiconductor substrate illustrating the formation of nitride blocks on the ultra-thin oxide in accordance with the present invention.

As can be seen in FIG. 6, a silicon nitride layer is deposited on the ultra-thin oxide 120 and is then etched back to form the silicon nitride layer blocks 125. The silicon nitride blocks 125 have a thickness between about 100 to 1000 angstroms. In the preferred embodiment, the silicon nitride blocks 125 are deposited by using low-pressure chemical vapor deposition (LPCVD) or plasma enhancement chemical vapor deposition (PECVD).

Figure 7:
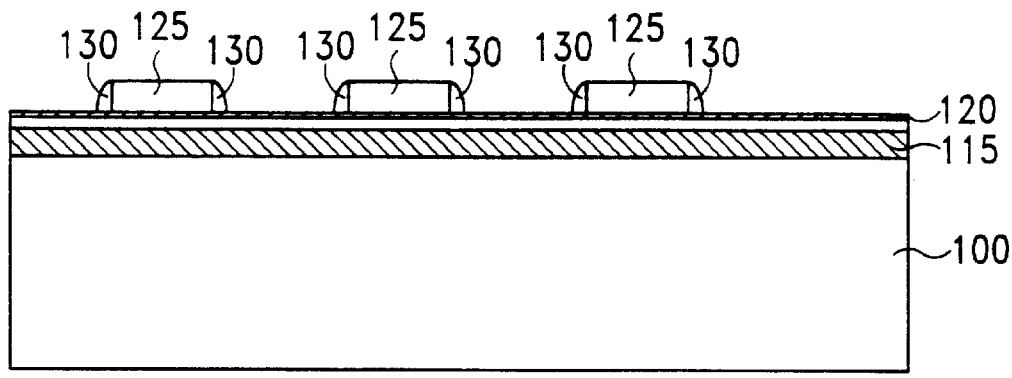
FIG. 7 is a cross-sectional view of a semiconductor substrate illustrating the formation of polysilicon spacers of the nitride blocks in accordance with the present invention.

Turning to FIG. 7, a polysilicon layer is deposited on the silicon nitride blocks 125 and then etched back to form polysilicon spacers 130. The polysilicon layer is deposited by low pressure chemical vapor deposition (LPCVD) system, at the pressure of 50 to 600 mtorrs and the temperature is between about 400° C. to 600° C. and the thickness is between about 50 to 500 angstroms.

Figure 8:
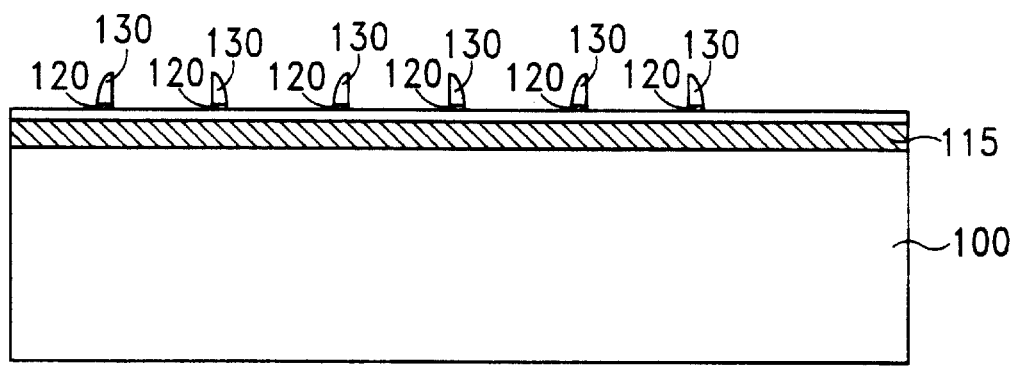
FIG. 8 is a cross-sectional view of a semiconductor substrate illustrating the removing of the nitride blocks in accordance with the present invention.

Turning to FIG. 8, the silicon nitride layer 125 is removed to form silicon islands on the substrate 100. The silicon nitride layer 125 is removed by using hot phosphoric acid ($H_3PO_4$) solution. The ultra-thin oxide 120 is then etched back by using the polysilicon spacers 130 as hard mask. The polysilicon spacers 130 and the remaining ultra-thin oxide films are used as hard mask to form silicon islands on the substrate 100.

Figure 9:
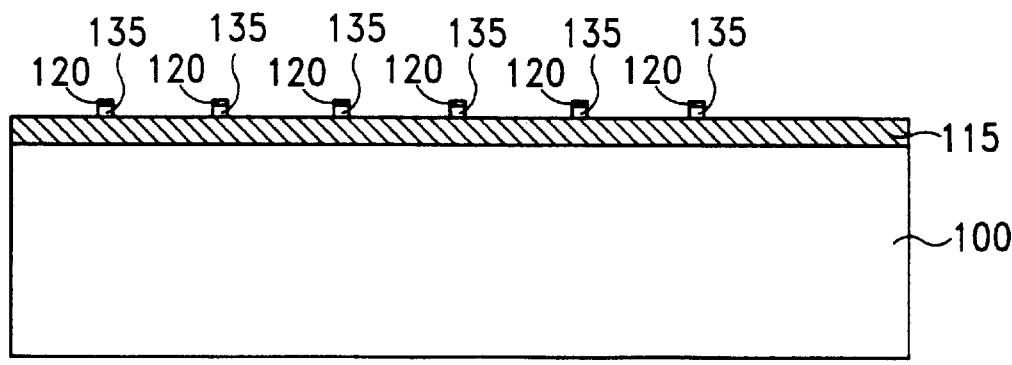
FIG. 9 is a cross-sectional view of a semiconductor substrate illustrating the formation of nanometer Si wires in accordance with the present invention.

As can be seen in FIG. 9, the nanometers Si substrate 100 is etched back to form nanometer Si islands by using the polysilicon spacers 130 and the ultra-thin oxide 120 as hard mask. Afterwards, nanometers Si wires 135 are formed over the buried oxide layer. In the preferred embodiment, a dry etching, such as plasma etching, is performed to form the silicon wire 135 on the substrate 100. In such case, the silicon wire 135 has width of between about 40 to 1000 angstroms.

Figure 10:
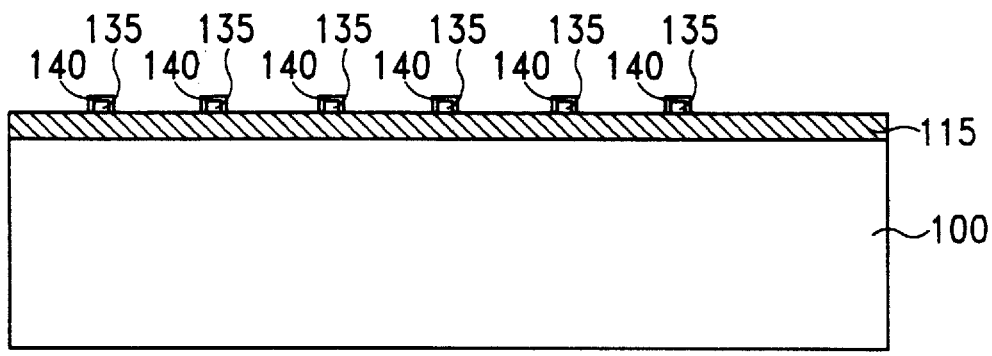
FIG. 10 is a cross-sectional view of a semiconductor substrate illustrating the formation of spacers of the gates and active region in the substrate.

As shown in FIG. 10, after the silicon wires 135 are formed, an ultra-thin oxynitride film 140 was grown on nanometer Si island by using $N_2O$ or NO gas. The ultra-thin oxynitride film 140 has a thickness between about 10 to 100 angstroms.

Turning to FIG. 11, a n+ polysilicon layer 145 is deposited as gate material of single electron tunneling (SET) device. In one case, the n+ polysilicon layer 145 is formed of in-situ doped polysilicon material and it is deposited by using conventional chemical vapor deposition (CVD), adding phosphorus gas or arsenic gas into CVD reactant gas as a doping source. The thickness of the n+ polysilicon is between about 200 to 2000 angstroms.

Referring to FIG. 11 again, a cross-sectional view of a single-electron-transistor memory array is shown. The buried oxide layer 115 is formed on the substrate 100. The plurality of silicon wires 135 are arranged on the buried oxide layer 115 and these are covered by the oxynitride layers 140. After the formation of the single-electron transistors, the polysilicon layer 145 covers the oxynitride layer 140 and the substrate 100.

After the above process, several nanometer silicon single electron tunneling (SET) devices are fabricated on the substrate 100 and these devices form a memory array. Referring to FIG. 12, a top view of the memory array is demonstrated and FIG. 11 is a cross sectional view of the FIG. 12 along AA' line. In this figure, the memory array is constructed on the buried oxide layer 115. The n+ doping polysilicon layer 145 is a wide band over the buried oxide layer and the silicon wires 135 is cross the polysilicon layer 145 to form single electron transistors (SET). In the drawing, the dash lines show the oxynitride layer 140 on the silicon wires 135. The two terminals of the silicon wires are connected to a source 10 and a drain 20. Besides, the n+ doping polysilicon 145 is connected to a gate 30. The memory array is controlled by using the source 10, the drain 20 and the gate 30. In the present invention, a serial of single electron transistor (SET) is fabricated and nanometer single electron transistors are manufactured in the substrate 100.

As is understood by a person skilled in the art, the foregoing preferred embodiment of the present invention are illustrative of the present invention rather than limiting of the present invention.

While the preferred embodiment of the invention has been illustrated and described, it will be appreciated that various changes can be made therein without departing from the spirit and scope of the invention.

What is claimed is:

1. A single-electron-transistor memory array, comprising:

a silicon substrate;

a buried oxide layer in a thickness about 0.3~0.5 micrometers formed in said silicon substrate, wherein said silicon substrate has a thickness over said buried oxide layer;

a plurality of silicon wires arranged on said buried oxide layer, each of said silicon wires having a pair of ends and said silicon wires being separated from each other, wherein the silicon wires are formed in accordance with a process comprising:

thermal oxidizing said silicon substrate to reduce the thickness of said silicon substrate on said buried oxide layer;

removing said thermal oxide layer; and patterning said silicon substrate on said buried oxide layer;

an oxynitride layer having a thickness about 10~100 angstroms formed on the surface of said silicon wires for isolation; and a polysilicon layer partially covering said oxynitride layers for perpendicularly bridging across said buried oxide layer and connecting to a gate electrode.

2. The memory array of claim 1, wherein said silicon wire has a width between about 40 to 1000 angstroms.

3. The memory array of claim 1, wherein said polysilicon layer over said silicon wire is formed of an n+ polysilicon material.

4. The memory array of claim 1, wherein said polysilicon layer over said silicon wire has a thickness between about 200 to 2000 angstroms.

* * * * *